United States Patent
Kim et al.

(10) Patent No.: US 7,359,598 B2
(45) Date of Patent: Apr. 15, 2008

(54) SURFACE PLASMON OPTIC DEVICES AND RADIATING SURFACE PLASMON SOURCES FOR PHOTOLITHOGRAPHY

(75) Inventors: Dai-Sik Kim, Seoul (KR); Sung-Chul Hohng, Seoul (KR); Christoph Lienau, Berlin (DE); Victor Malyarchuck, Berlin (DE); Jong-Wan Park, Taejon (KR); Yeo-Chan Yoon, Seoul (KR); Han-Youl Ryu, Taejon (KR); Kyeong-Hwa Yoo, Taejon (KR)

(73) Assignee: Seoul National University Industry Foundation, Seoul (KR)

( * ) Notice: Subject to any disclaimer, the term of this patent is extended or adjusted under 35 U.S.C. 154(b) by 493 days.

(21) Appl. No.: 10/494,814

(22) PCT Filed: Nov. 10, 2001

(86) PCT No.: PCT/KR01/01921

§ 371 (c)(1),
(2), (4) Date: Nov. 17, 2004

(87) PCT Pub. No.: WO03/042748

PCT Pub. Date: May 22, 2003

(65) Prior Publication Data

US 2005/0062973 A1    Mar. 24, 2005

(51) Int. Cl.
*G02B 6/26* (2006.01)
*G02B 6/42* (2006.01)
(52) U.S. Cl. ............... 385/45; 385/15; 385/31; 385/39; 385/42; 385/50
(58) Field of Classification Search ............ 385/45
See application file for complete search history.

(56) References Cited

U.S. PATENT DOCUMENTS 5,973,316 A * 10/1999 Ebbesen et al. ............ 250/216

(Continued)

FOREIGN PATENT DOCUMENTS

KR    1990-0016785    11/1990

(Continued)

OTHER PUBLICATIONS

Translation of English Abstract of Korean Patent Laid-Open Publication No. 1999-0016785, Publication Date: Nov. 14, 1990, 1 page.

(Continued)

*Primary Examiner*—Frank G. Font
*Assistant Examiner*—Ryan Lepisto
(74) *Attorney, Agent, or Firm*—Osha-Liang LLP

(57) ABSTRACT

Disclosed is a surface plasmon optic device that has a periodic array of apertures in a dielectric substrate and a metal film formed on the dielectric substrate and emits light from metal-air interface. The surface plasmon optic device includes a surface plasmon generating apparatus, a surface plasmon detecting apparatus, a surface plasmon controlling apparatus, an etching apparatus, etc. if a metal diffraction grating is disposed on the metal film having a well-defined interface, propagation of the surface plasmon can be efficiently reflected, divided and controlled. Further, radiating surface plasmon having a half period of a lattice constant formed at air-metal (1, 0) can be preserved at a distance of at least a few micron.

2 Claims, 12 Drawing Sheets

U.S. PATENT DOCUMENTS

| | | | |
|---|---|---|---|
| 6,040,936 A * | 3/2000 | Kim et al. | 359/245 |
| 6,052,238 A * | 4/2000 | Ebbesen et al. | 359/738 |
| 6,236,033 B1 * | 5/2001 | Ebbesen et al. | 250/216 |
| 6,285,020 B1 * | 9/2001 | Kim et al. | 250/216 |
| 6,649,901 B2 * | 11/2003 | Thio et al. | 250/216 |
| 6,836,494 B1 * | 12/2004 | Stuart | 372/39 |
| 6,977,767 B2 * | 12/2005 | Sarychev et al. | 359/321 |
| 7,027,689 B2 * | 4/2006 | Blumberg et al. | 385/39 |
| 7,039,277 B2 * | 5/2006 | Blumberg et al. | 385/39 |
| 7,039,315 B2 * | 5/2006 | Blumberg et al. | 398/49 |
| 7,110,154 B2 * | 9/2006 | Ballato et al. | 359/245 |
| 7,206,114 B2 * | 4/2007 | Ballato et al. | 359/245 |

FOREIGN PATENT DOCUMENTS

KR 2000-0077236 12/2000

OTHER PUBLICATIONS

Translation of English Abstract of Korean Patent Laid-Open Publication No. 2000-0077236, Publication Date: Dec. 26, 2000, 1 page.

S.C. Hohng, et al., "Transmission, Control and Coherent Propagation of Surface Plasmons in Metal Nanostructures", Quantum Electronics and Laser Science Conference, May 6-11, 2001, 5 pages.

\* cited by examiner (a)

(b)

(c)

(d)

(b)

(c)

(d)

(e)

(a)

(b)

SURFACE PLASMON OPTIC DEVICES AND RADIATING SURFACE PLASMON SOURCES FOR PHOTOLITHOGRAPHY

TECHNICAL FIELD

The present invention relates to a device for generating and adjusting surface plasmon using periodically arranged apertures formed in a metal film and a photolithography device using the same.

BACKGROUND ART

Generally, a thick metal film has a non-transmission property with respect to incident light. Even though apertures are formed through the metal film, if a size of each aperture is much smaller than a wavelength of the incident light, a light amount transmitted through the metal film is remarkably reduced. However, it is well known that, if the apertures are periodically arranged in the metal film and an arranged period of the apertures has a size of the wavelength of the incident light, the light is efficiently transmitted through the metal film, though each aperture has a smaller size than the wave length of the incident light. Furthermore, as a result of recent research, a spectral position and intensity of such transmission resonance phenomenon is clearly expounded by an existing surface plasmon theory. However, it is a fact that understanding of a microscope in such phenomenon is still lack.

While studying the nanoscopic emission property of such arrays, it was founded that light on a non-illuminated side was mostly emitted from a metal surface outside the apertures with polarization-controlled interference pattern. This observation is in contrast to macroscopic expectations and previous theoretical and experimental works that light should be emitted only from the apertures.

In addition, by a nano-optical experiment performed while varying wavelength and polarization of the incident light, and a size of a geometrical structure of the apertures formed in the metal film, mage system, it was founded that the surface plasmon formed on a metal diffraction grating could be propagated at a distance of a few tens micrometer, while preserving coherence.

And it was also found that, if the polarization and wavelength of the incident light is regulated, a pattern of the light emitted from an air-metal interface could be controlled, and particularly, the pattern can be represented by the square of a sine function in an air-metal (1, 0) mode. As getting farther away from the surface, a distribution of the light emitted at this time is more simplified and thus more similar to a shape of the square of the sine function. A period of the square of the sine function is equal to a lattice constant, and a period of the original sine function before squaring is twice as much as the lattice constant. Since this mode has a form of "lattice constant=wavelength/2", it is called a half wavelength mode. In the half wavelength surface plasmon mode, it is possible to emit the light in a far range of view contrary to the existing surface plasmon that is restricted to the surface. Therefore, the inventors named the half wavelength surface plasmon 'radiating surface plasmon'. Since a pattern of the radiating surface plasmon is preserved in a far distance, it can be used for novel lithography.

By a near-field study associated with a light radiation type which is occurred on the air-metal interface when light is irradiated on the metal diffraction grating having a periodic aperture array formed on a dielectric substrate, the inventors obtained ideas as follows: first, the metal diffraction grating can be used as a surface plasmon detecting apparatus as well as a surface plasmon generating apparatus having a well-defined propagation direction. Secondly, if the metal diffraction grating is disposed on a metal film having a well-defined interface, it can be used as a surface plasmon optic apparatus which can effectively reflect, separate and control wave of the surface plasmon. Thirdly, if the wavelength and polarization of the light irradiated on the metal diffraction grating is adjusted, the light radiation type generated from the air-metal interface can be also adjusted. Particularly, since the radiating surface plasmon formed in the air-metal (1, 0) mode and having a half period of the lattice constant can maintains its shape up to a size of a few micron, it can be used as a new etching apparatus. Considering that a role of the surface plasmon improving the efficiency of an optic device is noticed, it is expected that there is a possibility of various applications.

DISCLOSURE OF THE INVENTION

Therefore, the first object of the present invention is to provide a surface plasmon generating apparatus in which a propagation direction can be optically and easily adjusted using a metal diffraction grating having a periodic aperture array.

The second object of the present invention is to provide a detecting apparatus which can efficiently detect the propagating surface plasmon using the metal diffraction grating having periodic high variety.

The third object of the present invention is to provide a surface plasmon splitter in which another metal diffraction grating is disposed in the propagation direction of the surface plasmon so as to divide the propagation direction of the surface plasmon into two. This utilizes a feature that the surface plasmon can be propagated in the macroscope while having the coherence.

The fourth object of the present invention is to provide another type surface plasmon splitter using a tunneling effect for a gap formed between separated metal films.

The fifth object of the present invention is to provide a surface plasmon mirror using a metal surface that forms a specific angle with the propagation direction of the surface plasmon. This utilizes a feature that the surface plasmon can be propagated only on the metal surface.

The sixth object of the present invention is to provide an apparatus for controlling the surface plasmon, which can control the propagation direction and speed of the surface plasmon using electric field.

The seventh object of the present invention is to provide an optical etching apparatus using a radiating surface plasmon mode of a half wavelength. This utilizes a feature that the radiating surface plasmon mode of a half wavelength can preserve its pattern even at a distance of a few micrometer.

In order to achieve the above objects, a surface plasmon generating apparatus of the present invention comprises a dielectric substrate having a first surface and a second surface; an optically thick metal film having a first surface and a second surface, the first surface of the metal film being substantially contacted to the second surface of the dielectric substrate; and a periodic array of nanometer-sized apertures which penetrate the first surface and the second surface of the metal film. If light is incident from the first surface side of the dielectric substrate to the periodic aperture array, air-metal mode surface plasmon is excited on the second surface of the metal film, and the light in the form of a stripe is emitted. The light having a wavelength and polarization suitable for a surface plasmon resonance condition is incident to the metal diffraction grating, thereby simply and efficiently generating the surface plasmon having a well-defined propagation direction.

A surface plasmon detecting apparatus of the present invention is formed by coupling a metal diffraction grating having a metal surface to a local optical detecting apparatus, wherein a height of the metal surface located at a propagation direction of the surface plasmon is varied.

A surface plasmon splitter using coherence of the surface plasmon according to the present invention comprises a metal diffraction grating having a periodic aperture array or a cylindrical array located at the propagation direction of the surface plasmon. The surface plasmon dispersed in each aperture or cylinder of the metal diffraction grating can be divided and propagated only in a specific direction that satisfies a constructive interference condition. Using the coherence of the surface plasmon, the surface plasmon splitter of the present invention can effectively divide the surface plasmon.

Another surface plasmon splitter using a tunneling effect of the surface plasmon comprises separated two metal interfaces respectively having a specific angle with respect to the propagation direction of the surface plasmon, and a dielectric body filled therebetween. At this time, a distance between the two metal films and a rate of the surface plasmon divided by a dielectric constant of the dielectric body can be controlled, and also the propagation direction of the surface plasmon reflected by an angle of the metal interface with respect to the propagation direction can be controlled. Therefore, the surface plasmon splitter of the present invention can facilely control a separate rate of the surface plasmon and the propagation direction.

A surface plasmon mirror of the present invention comprises a metal interface having a specific angle with respect to the propagation direction of the surface plasmon, and a dielectric body outside the metal interface. This uses a characteristic that the surface plasmon can be propagated only along the metal surface. A reflection rate is decided by a dielectric constant of the dielectric body and the propagation direction of the reflected surface plasmon is decided by an angle of the metal interface with respect to the propagation direction of the plasmon. Therefore, the surface plasmon mirror can efficiently control the propagation direction of the surface plasmon.

A surface plasmon controlling apparatus using electric field forms electrodes at both ends in the propagation direction of the surface plasmon, thereby controlling the propagation speed and the propagation direction of the surface plasmon. For example, the propagation of surface plasmon can forms the electrodes at both ends to control a voltage applied therebetween, thereby forming or eliminating a flow of the surface plasmon. This is based on a theory that the propagation of surface plasmon can be controlled using the electric field. Therefore, the surface plasmon controlling apparatus can efficiently control the surface plasmon using the electric field.

A photolithography device of the present invention is to form a desired pattern on a photoresist-layered substrate. The device comprises a light source for photolithography, a photolithographic mask (metal diffraction grating) having a periodic aperture array in the metal film, and a photoresist-layered substrate on which the pattern will be formed. At this time, since a pattern of light emitted from the photolithographic mask can be controlled by varying the wavelength and polarization of the incident light, various patterns can be formed using a single photolithographic mask. Further, since the pattern can be preserved even at a distance of more than a few micro apart from the photolithographic mask, a distance between the photolithographic mask and the photoresist-layered substrate can be apart from each other at a large distance.

BRIEF DESCRIPTION OF DRAWINGS

FIG. 3a is a view showing a near-field transmission image at a sapphire-silver (1, 1) mode resonance;

FIG. 3b is a view showing a near-field transmission image at an air-silver (1, 0) mode resonance;

FIG. 3c is a view showing an image at an edge of a periodic aperture array in the metal film of FIG. 3a;

FIG. 3d is a view showing an image at an edge of a periodic aperture array in the metal film of FIG. 3b;

FIG. 3e is a graph showing an intensity of the radiated light with respect to a horizontal direction of FIGS. 3c and 3d;

FIG. 4a is a schematic view showing a wave characteristic experiment of an air-silver (1, 0) mode surface plasmon;

FIG. 4b is a view of an image of the AFM at an edge of a portion G1 of FIG. 4a;

FIG. 4c is a view of a near-field emission pattern in FIG. 4b;

FIG. 4d is a view of a near-field emission pattern in a case that a polarization of incident light is rotated at an angle of 90° with respect to FIG. 4c;

FIG. 4e is a graph showing an intensity of the radiated light with respect to a horizontal direction of FIGS. 4b and 4c;

FIG. 5a is a view showing a waveguiding experiment of an air-sapphire (0, 1) mode surface plasmon;

FIG. 5b is a view showing an image of the AFM of FIG. 5a;

FIG. 5c is a view showing a near-field emission pattern recorded with the image of the AFM at the same time;

FIG. 12a is a perspective view of a photolithographic mask according to an embodiment of the present invention; and FIG. 12b is a perspective view of a photoresist-layered substrate on which a patter is formed using the photolithographic mask of FIG. 12a.

BEST MODE FOR CARRYING OUT THE INVENTION

The present invention will now be described in further detail by examples.

Referring to FIG. 1 to FIG. 5c, it will be described of generation, propagation and interference characteristics of surface plasmon, which are found by experiments of the inventors.

Figure 1:
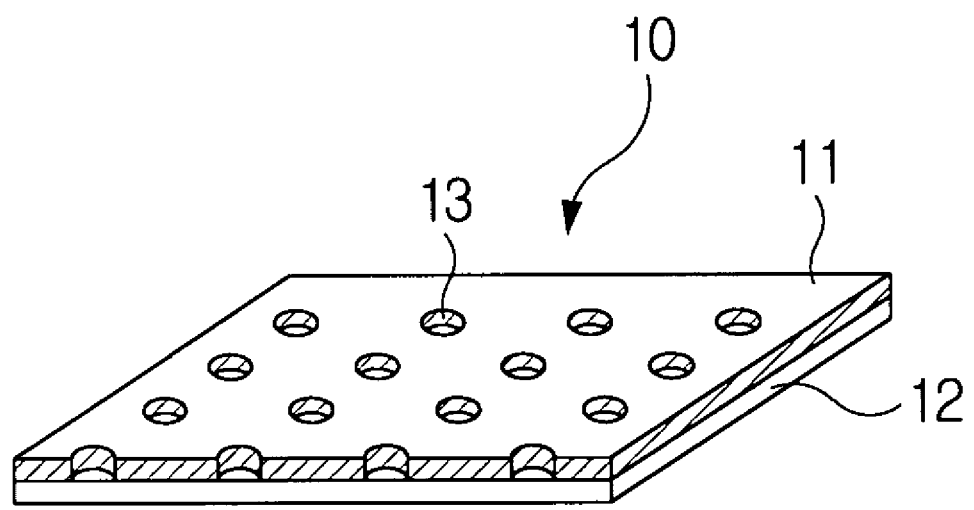
FIG. 1 is a perspective view of a surface plasmon generating apparatus of the present invention to show a principle of generating the surface plasmon.
Figure 2:
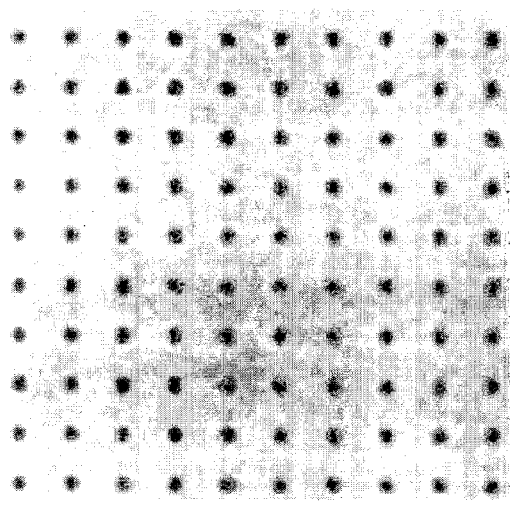
FIG. 2a is a view of an image of an electron microscope showing a periodic array of apertures formed in a metal film of FIG. 1.
FIG. 2b is a view showing a far-field transmission spectrum in a case that light is incident to the surface plasmon generating apparatus of FIG. 1.
FIG. 2c is a view showing an image of an atomic force microscope (AFM) in the case that light is incident to the surface plasmon generating apparatus of FIG. 1.
FIG. 2d is a view showing a near-field transmission image at an air-metal (0, 1) resonance in the case that light is incident to the surface plasmon generating apparatus of FIG. 1.
Figure 2:
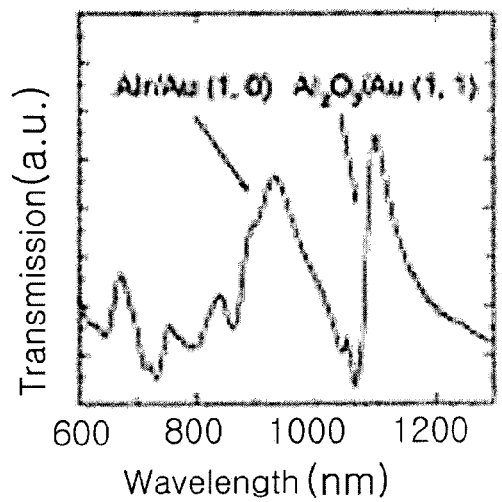
Figure 2:
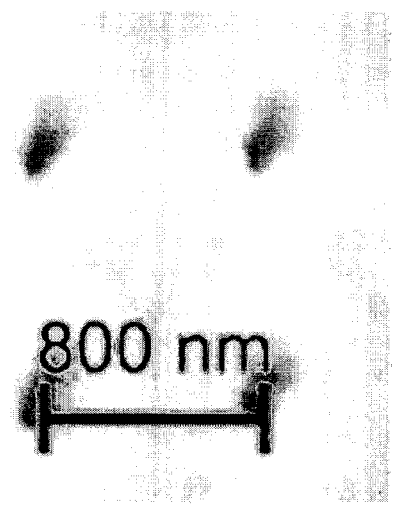
Figure 2:
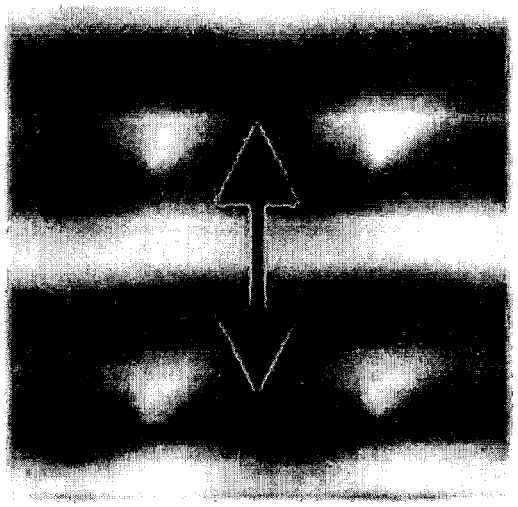
Figure 3:
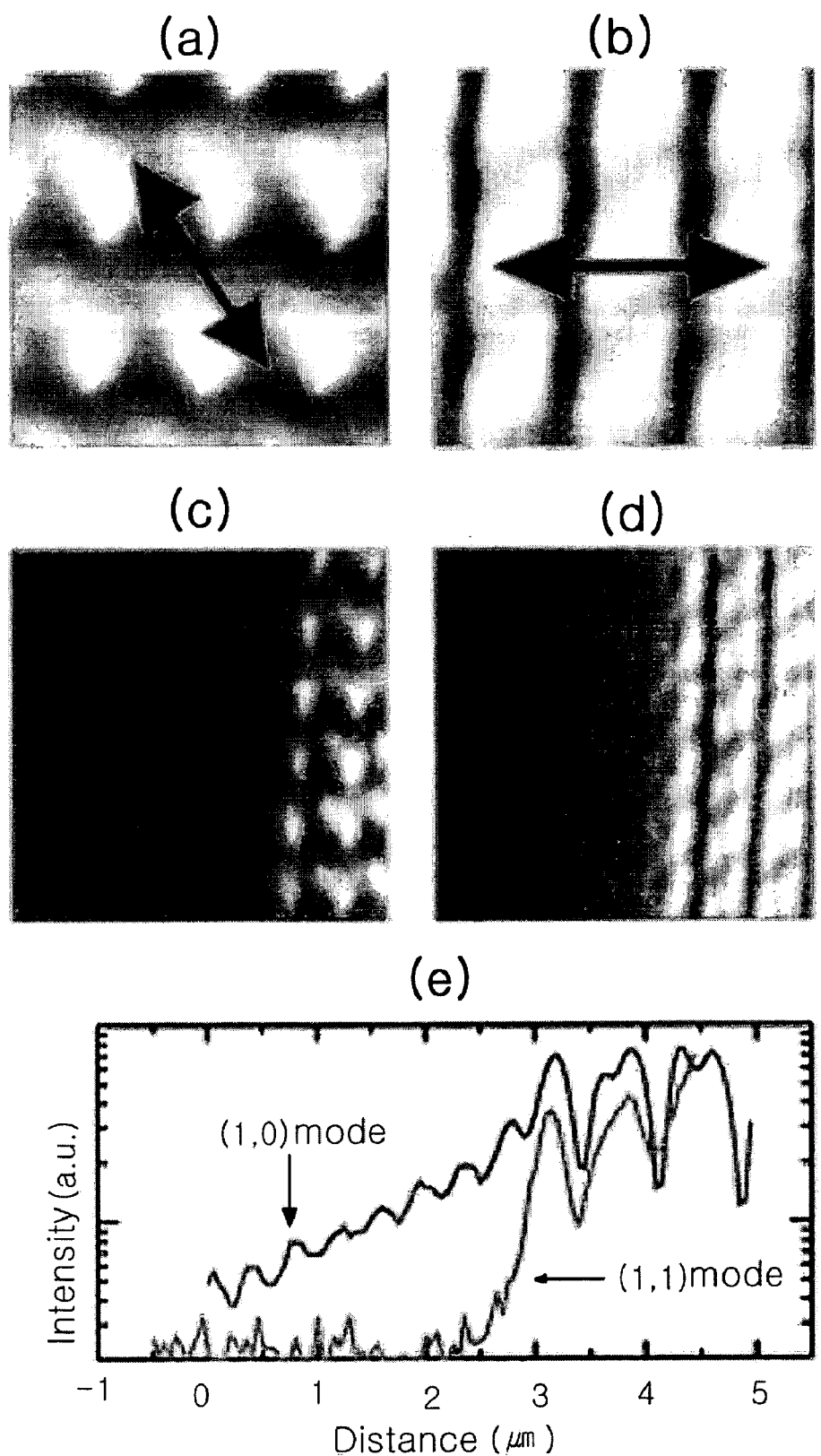
Figure 4:
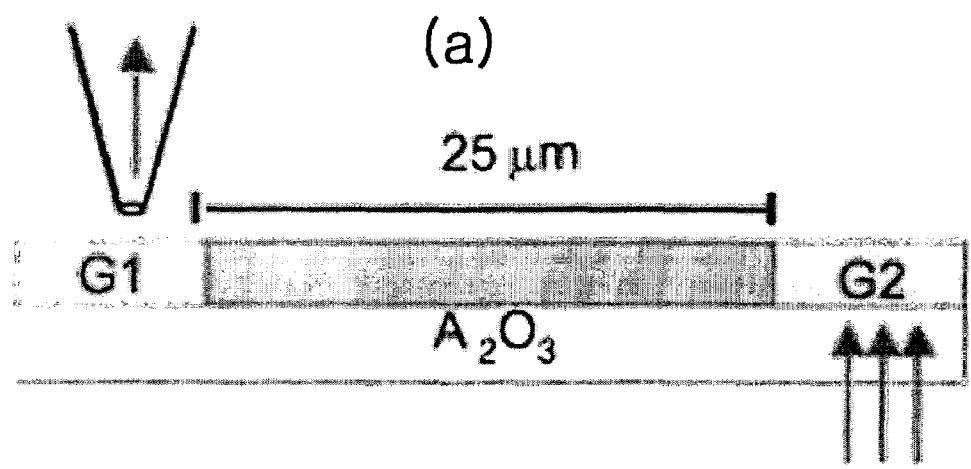
Figure 4:
Figure 4:
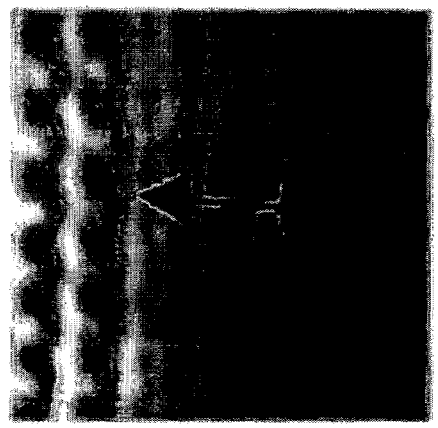
Figure 4:
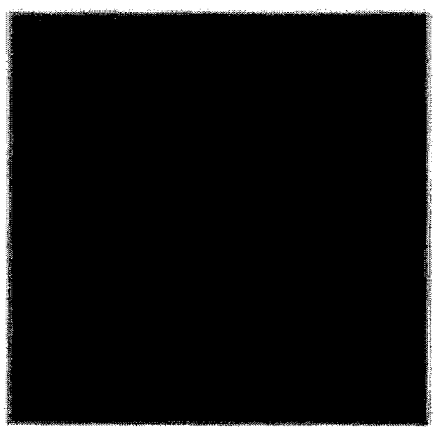
Figure 4:
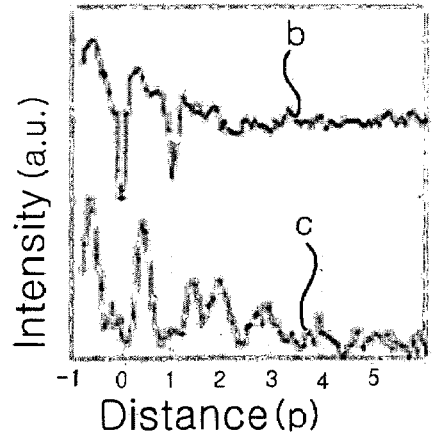
Figure 5:
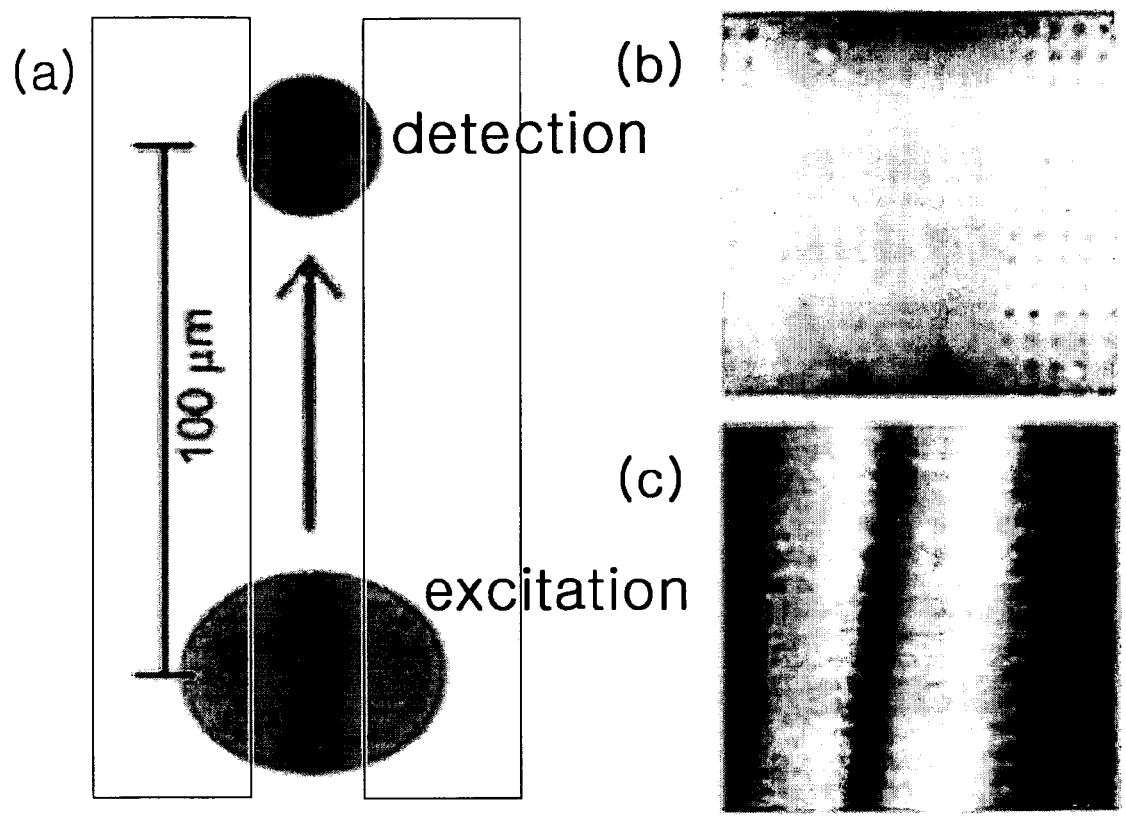

FIG. 1 is a perspective view of a surface plasmon generating apparatus having a periodic aperture array of a grating structure according to the present invention. The surface plasmon generating apparatus 10 comprises a dielectric substrate 12 having an upper surface and a lower surface, an optically thick metal film 11 formed on the upper surface of the dielectric substrate 12, and an array of a periodic grating structure of a two dimensional nanometer-sized aperture 13 formed in the metal film 11. The metal film 11 is made of a metal such as gold and silver, and deposited in a thickness of 300 nm on the dielectric substrate 12. The array of the aperture 13 is formed using a dry etching technique after e-beam lithography.

FIG. 2a shows an image of an electron of a typical metal film 11 having an aperture array, and FIG. 2b shows a far-field transmission spectrum of a surface plasmon generating apparatus 10, which is formed on the metal film 11 made of gold of 300 nm thickness, in which an aperture 13 having a diameter of 150 nm is formed with a period of 800 nm.

As shown in FIG. 2b, surface plasmon resonance is clearly observed at both interfaces, i.e., air-metal and sapphire-metal interfaces. In FIG. 2b, a peak of 930 nm is corresponded to air-metal surface plasmon resonance with (m, n)=(1, 0) or (0, 1), and a peak of 1200 nm is sapphire-metal surface plasmon resonance with (m, n)=(1, 1).

In general, since a dispersion curve of light is not intersected with that of the surface plasmon, the light cannot directly coupled to the surface plasmon. However, in a square grating structure of an aperture array with a period of P, photons can be excited to the surface plasmon by picking up a grating momentum G=2π/P to satisfy a following equation for momentum conservation:

$$k_{sp}=k_{ph}\pm mGx\pm nGy \quad (1)$$

Here, m and n are integral numbers, x and y are unit vectors for each direction, and $k_{sp}$ and $k_{ph}$ are respectively surface plasmon and photon planar wavevector.

For normal incidence, a resonant wavelength can be approximated by the following equation:

$$P\sqrt{\epsilon/(m^2+n^2)} \quad (2)$$

Here, ε is a dielectric constant of air or sapphire.

FIGS. 2c and 2d shows a result of using a near-field scanning optical microscope (NSOM) in a transmission mode in which a continuous wave Ti:Sapphire laser is incident to a sapphire-metal side and a metal-coated fiber tip with an aperture having a diameter of 100 nm collects light on a air-metal side. FIG. 2c shows an image of an atomic force microscope (AFM), which is obtained by using the NSOM, and FIG. 2d shows a near-field image for resonant excitation of air-metal (0, 1) mode surface plasmon with vertically polarized light (arrow direction). In contrast to an expectation that the light will be mainly emitted from the aperture, most of the emitted light is found on a flat metal surface in the form of a stripe perpendicular to a polarization direction of the incident light. In case horizontally polarized light is incident, the stripe of the transmitted light is perpendicular to the polarization direction of the incident light. Generally, striking emission outside the aperture is found in the form of a stripe-like pattern.

In the above experiment, compared with the near-field image of the sapphire-metal mode and that of the air-metal mode, as shown in FIG. 3a, the sapphire-metal (1, 1) mode is mostly localized around the aperture and shows a symmetry of a gating Bragg vector along a (1, 1) direction which is an arrow direction of FIG. 3a. However, it does not show any emission stripe. On the contrary, the air-metal (1, 0) mode shows the stripe perpendicular to the arrow direction of FIG. 3b, as shown in FIG. 3b.

Furthermore, at an edge of the grating pattern by the aperture array, an image is remarkably different between the sapphire-metal (1, 1) mode and the air-metal (1, 0) mode. As shown in FIG. 3c, while the intensity in the sapphire-metal mode is sharply decreased at the edge, coherent oscillation of the emission intensity for the air-metal (1, 0) mode is persisted for more than a few microns of distance.

To understand the images of FIGS. 2a and 3e, it is important to consider the momentum conservation in terms of coupling between the surface plasmon and the light. Because of the different dielectric constants of the air and sapphire, an allowed mode on one interface is forbidden on the other interface in the limit of a small aperture. Therefore, the air-metal mode plasmon, although only weakly excited in the generation process on the irradiated sapphire-metal side, is remarkably generated on the air-metal side, and can be efficiently converted into light, once the air-metal mode plasmon is excited by the periodic aperture array and propagated along the metal surface and forms an interference pattern.

Therefore, as shown in FIGS. 3b and 2d, the emission patterns of these modes are dominated by a standing wave interference of the surface plasmon with $k_x=\pm 2\pi m/p$ or $k_y=\pm 2\pi n/p$. A contrast in the near-field image of more than 95% indicates highly efficient wavevector-selection similar to an effect observed in a photonic bandgap structure.

Meanwhile, the sapphire-metal mode does not satisfy the momentum conservation, once it is exposed to the air-metal interface. Moreover, because of large velocity ("impedance") mismatch between these two interfaces, it is likely that the sapphire-metal mode would have a shorter spatial coherence length than that at the air/metal interface, as is evident from the localized emission pattern of the sapphire-metal (1, 1) mode. Therefore, the mode that strongly excited at one interface cannot be efficiently coupled to light on the other interface.

A 'decay length' deduced from FIG. 3e is of the order of a micron, but this length should not be taken as a propagation length of the surface plasmon. It merely shows the decay length of the surface plasmon pattern which is strongly affected by radiation loss. Non-radiating surface plasmon can be propagated over a much larger distance.

As described above, all of the sapphire-metal mode and the air-metal mode are indicated at the air-metal interface. The difference between the two modes is caused by the difference between the dispersion curves. The wave of the surface plasmon is propagated better at the air-metal interface. Therefore, it is obvious that the air-metal mode is more proper than the sapphire-metal mode in order to utilize the propagation characteristic of the surface plasmon excited by the aperture array.

The next experiment is to estimate the propagation characteristic, particularly, the propagation length of the surface plasmon. As shown in FIG. 4a, light is incident to a first grating structure G2 and excites the plasmon. Then, the near-field emission pattern on a second grating structure G1 that is apart at a distance of 25 microns is detected. The first and second grating structures are formed by the periodic aperture array. FIG. 4b shows an AFM image at an edge of the second grating structure G1.

Further, FIG. 4c shows a near-field emission pattern at the edge of the second grating structure G1, and FIG. 4d shows a near-field emission pattern in a case that polarization of the incident light is rotated by 90 degrees with respect to FIG. 4c. When the polarization of the incident light is parallel to a line connecting the first and second grating structures G2 and G1, as shown in FIG. 4c, a strong signal is detected. When the polarization direction of the incident light is rotated by 90 degrees, as shown in FIG. 4d, no signal is detected.

This clearly demonstrates that the propagation direction of the surface plasmon generated at the first grating structure G2 is parallel to the polarization of the incident light, and the propagation length of the surface plasmon is of the order of 10 microns. A value of the propagation length is similar to a propagation length on a planar metal film of silver. A clear interference pattern in FIG. 4c indicates that the surface plasmon at the first grating structure G2 is propagated up to the second grating structure G1, while preserving the coherence.

FIG. 4e is a cross-sectional view in a horizontal direction of FIGS. 4b and 4c. As shown in FIG. 4e, the aperture of the pattern of the second grating structure G1 appears essentially dark. This suggests that the air-metal mode surface plasmon on the second grating structure G1 flows along the surface of the aperture to the sapphire-metal interface, in analogy with the sapphire-metal mode surface plasmon appearing on the air-metal interface, as shown in FIG. 3a.

Efficient generation of the surface plasmon propagating over mesoscopic distance proposes a new way for operating the plasmon-field at the air-metal interface. As shown in FIG. 5a, this is demonstrated by analyzing the emission characteristic of the surface plasmon at a surface plasmon waveguide structure comprised of two adjacent aperture arrays in which a detecting position and an excitation position are apart at a distance of 100 μm. The excited wavelength is turned to the air/silver (0, 1) mode resonance with the incident polarization parallel to a vertical direction. String light emission is detected inside a waveguide region with an emission pattern similar to a excitation mode of a rectangular waveguide. The emission is not detected at the center of the aperture array, whereas a weak emission component (centered around the aperture) is found at an edge of the aperture array, and this is rapidly decayed towards an inner part of the aperture array. Near the excitation spot, of course, the light emission from the two grating areas is much stronger than that from the flat metal surface between the grating areas. However, with increasing distance from the excitation spot, the radiation loss for waves propagated inside the grating array is large and those waves are strongly damped. On the other hand, the radiation loss for waves guided along a connecting metal strip is drastically reduced inside the waveguide structure. Therefore, a propagation path of plasmon is formed by the aperture array, whereby the propagation length can be increased.

According to the experiment result as described above, even though the metal film is much thicker than a penetration depth, the light is strongly emitted from a non-transparent metal surface. This surprising phenomenon results from the generation, propagation and interference of the surface plasmon that couples strongly to the light. Nearly equal strengths of the air-metal resonance and sapphire-metal resonance in far-field transmission can be understood in terms of balance between the excitation and the emission processes. The surface plasmon propagation direction is controlled by light polarization and the propagation distance can easily be more than 100 micron. This result suggests novel applications of the metal grating as a surface plasmon source and nano-optical surface plasmon detector.

Figure 6:
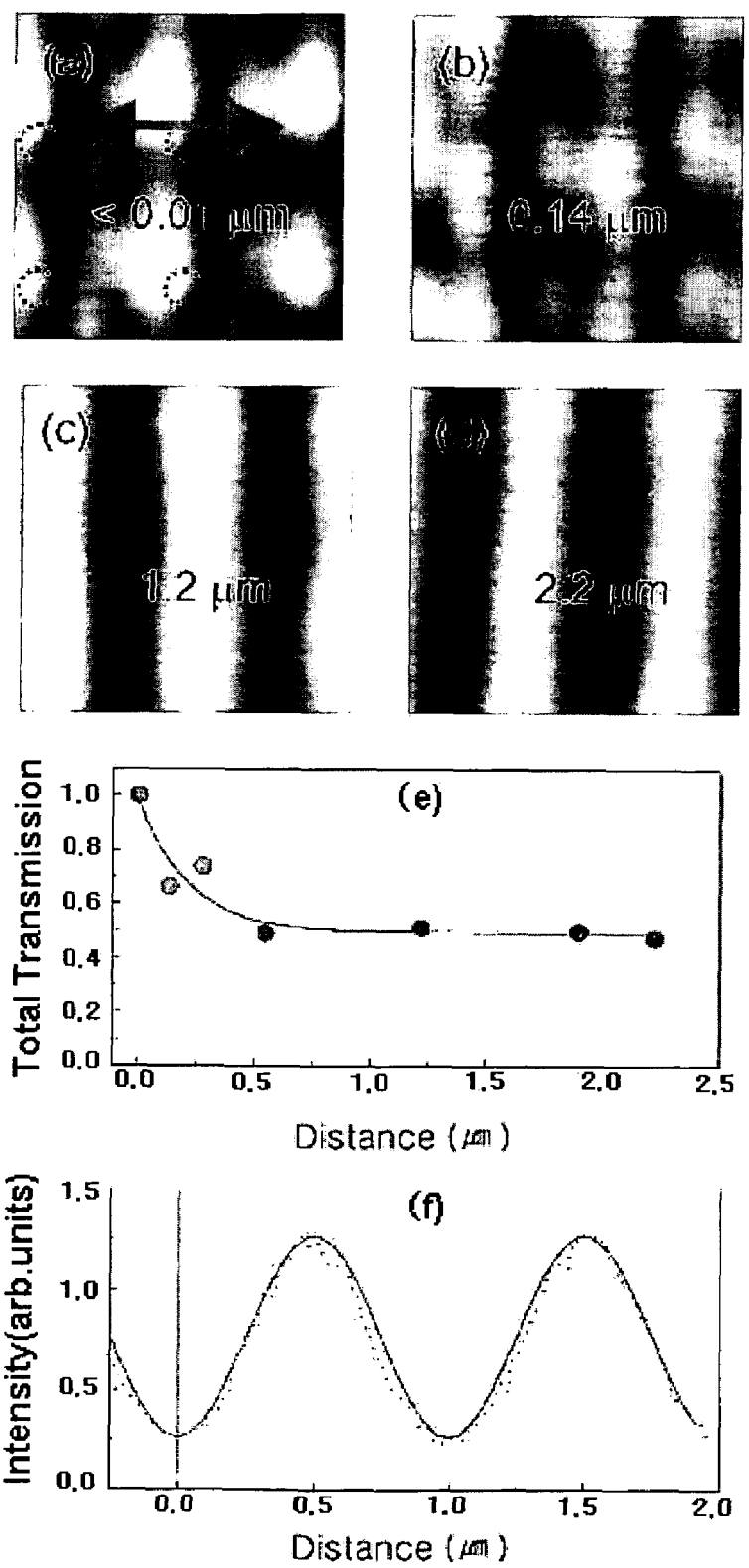
FIG. 6a is a view showing a emission pattern of an air-gold (1, 0) mode at the near-field.
FIG. 6b is a view showing a emission pattern of the air-gold (1, 0) mode at a point apart from a surface at a distance of 0.14 micrometer.
FIG. 6c is a view showing a emission pattern of the air-gold (1, 0) mode at a point apart from the surface at a distance of 1.2 micrometer.
FIG. 6d is a view showing a emission pattern of the air-gold (1, 0) mode at a point apart from the surface at a distance of 2.2 micrometer.
FIG. 6e is a graph of an entire intensity of the light radiation as a distance function from the surface.
FIG. 6f is a graph showing a function of the intensity of the light radiation and a distance of a horizontal direction.

FIG. 6 shows a variety of light emission pattern according to a distance between a metal surface and a tip at the air-gold (1, 0) mode. As shown in FIGS. 6a-6d, the emission pattern is well preserved up to a distance of more than 2.2 micrometer. Most of the signals are not evanescent waves limited to the surface, but the light emitted up to a far distance. A quantitative analysis also proves positively the fact. FIG. 6e shows an amount of entire signals integrated with respect to a xy-plane, which is represented by a function of a distance z between a tip and a sample. It will be apparent that more than a half of the near-field signals are emitted up to the far distance. Further, since the evanescent wave is vanished away at a distance of a few hundreds nanometer, as shown in FIG. 6f, if the distance is far away, the light radiation type is simplified and changed into a form of $\sin^2(\pi x/\alpha_0)$ which is added by a small constant. Here, $\alpha_0$ indicates a lattice constant. This fact means that there is an existence of a radiating surface plasmon mode in which a x-directional period of $E_x$ is $2\alpha_0$. Also, a characteristic that a pattern of this mode is well preserved can be applied to a new photolithography device.

Figure 7:
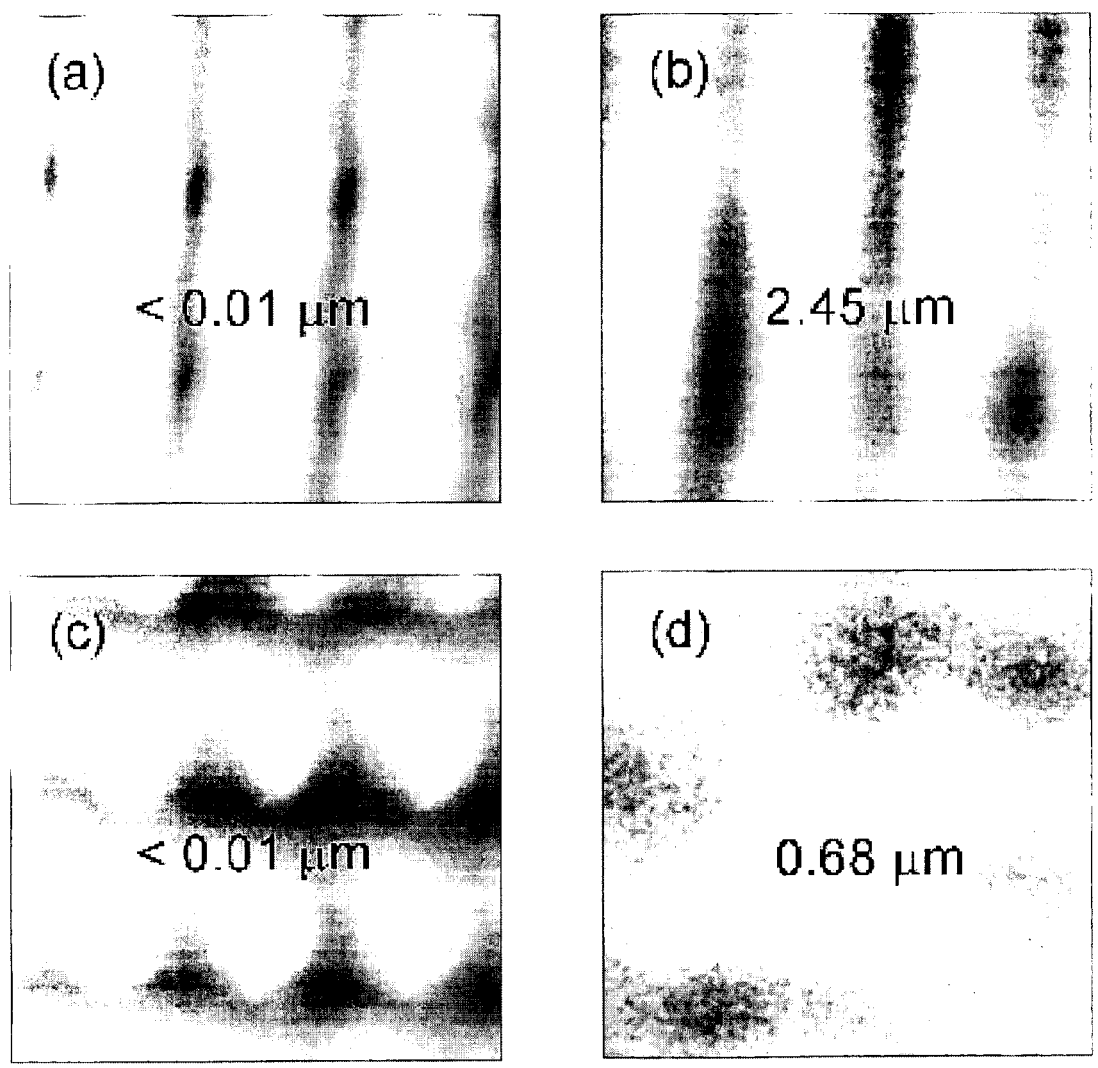
FIG. 7a is a view showing a emission pattern of an air-silver (1, 0) mode at the near-field.
FIG. 7b is a view showing a emission pattern of the air-silver (1, 0) mode at a point apart from the surface at a distance of 2.45 micrometer.
FIG. 7c is a view showing a emission pattern of a sapphire-silver (1, 1) mode at the near-field.
FIG. 7d is a view showing a emission pattern of the sapphire-silver (1, 1) mode at a point apart from the surface at a distance of 0.68 micrometer.

However, as shown in FIG. 7, the radiating surface plasmon is not formed in all surface plasmon resonance conditions. In FIG. 7, the varieties of the emission patterns according to a distance between the tip and the sample at the air-silver (1, 0) mode and the sapphire-silver (1, 1) mode are compared to each other. In the same manner as FIG. 6, the pattern of the air-silver (1, 0) mode is well preserved up to the far distance, but the pattern of the sapphire-silver (1, 1) mode is vanished within a distance of a few hundreds nanometer.

Figure 12:
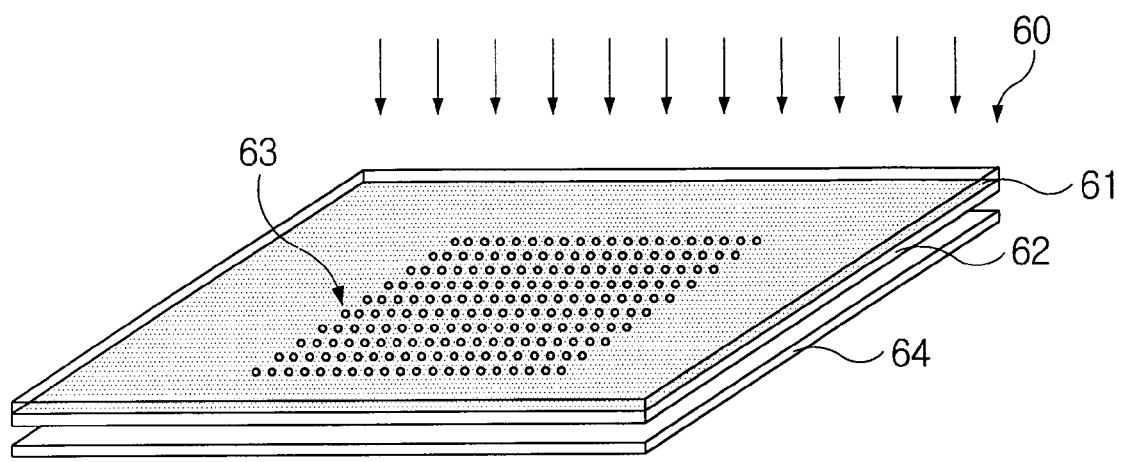
Figure 12:
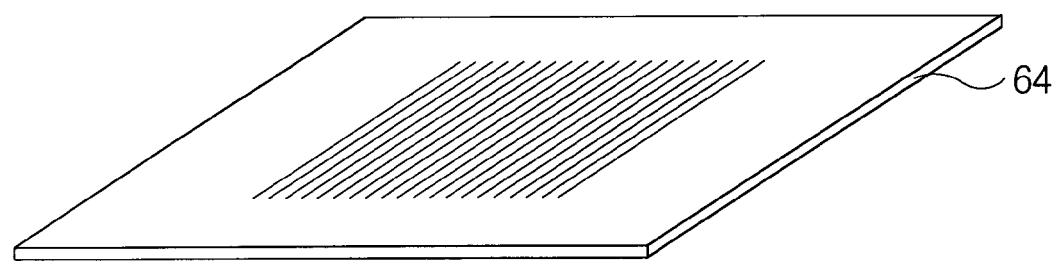

Referring now to FIGS. 1, 6 and 12b, embodiments of a surface plasmon apparatus according to the present invention will be described.

FIG. 1 is a perspective view of a surface plasmon generator 10 according to the present invention. As shown in FIG. 1, a metal film 11 is formed on a dielectric substrate 12 such as a sapphire, and includes a plurality of periodically arranged apertures 13 with a grating structure therein. As described above, when light is incident on the periodic aperture array from the side of the dielectric substrate 12, surface plasmon is excited by the periodic aperture array, and the surface plasmon generator 10 thus generates surface plasmon efficiently and easily.

Figure 8:
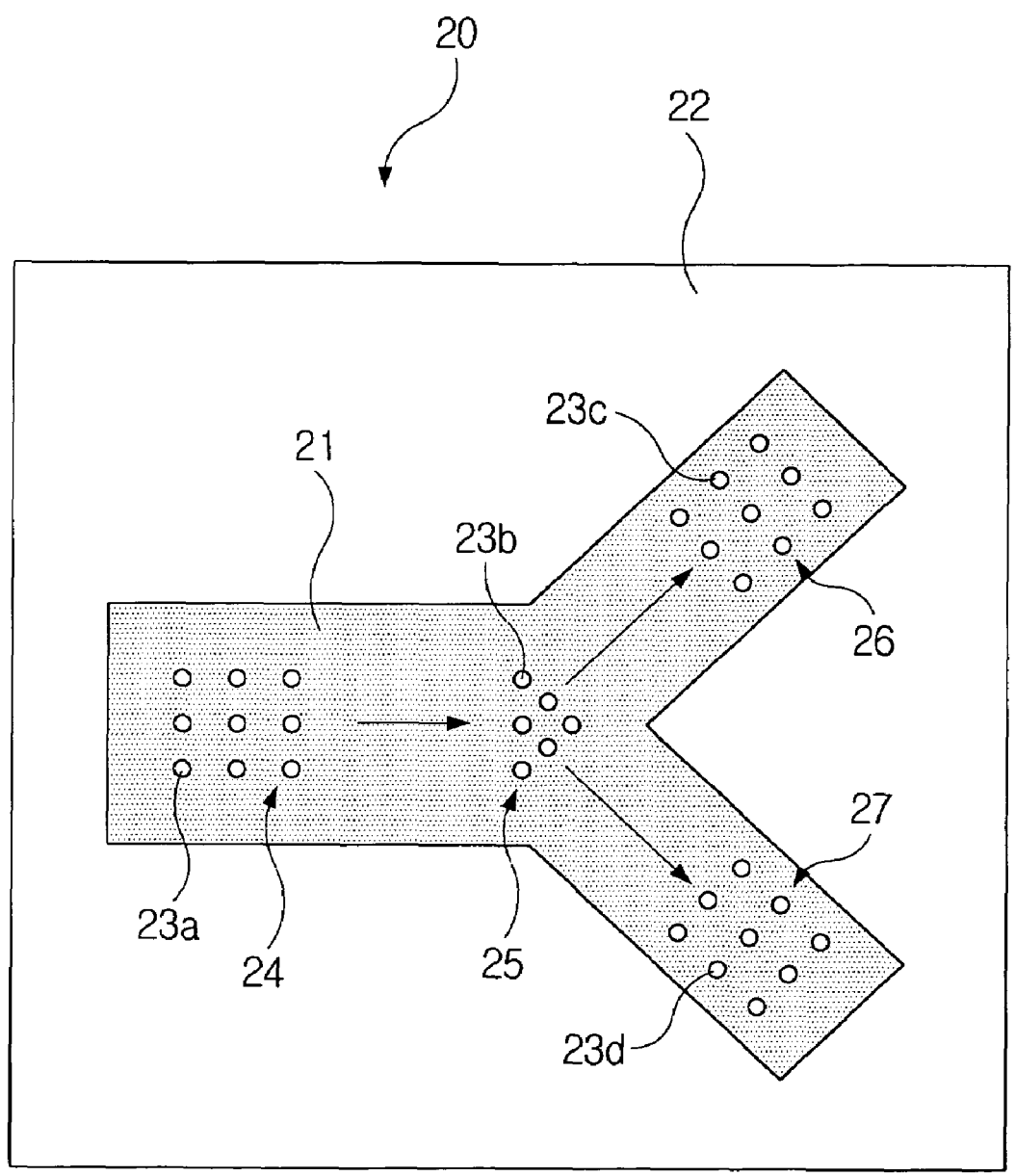
FIG. 8 is a plane view of a surface plasmon splitter according to an embodiment of the present invention.

FIG. 8 is a plan view showing a surface plasmon splitter 20 using coherency according to the present invention. As shown in FIG. 8, a metal film 21 is formed on a dielectric substrate 22 such as a sapphire in branchlike shape. On one end of the metal film 21 is formed a first grating structure 24 having periodically arranged apertures 23a which acts as a surface plasmon generator. A central portion of the metal film 21, for example, is divided into a least two portions in branchlike shape from the one end of the metal film 21 as shown in FIG. 8, and forms a second grating structure 25 having periodically arranged apertures or cylinders 23b which acts as a surface plasmon splitter. End portions of the metal film 21 divided in branchlike shape from the central portion of the metal film 21, respectively include a third grating structure 26 and a fourth grating structure 27. The grating structures 26 and 27, respectively have periodically arranged apertures or cylinders 23c and 23d, each of which acts as a surface plasmon detector.

When horizontally polarized light is incident on the first grating structure 24 of the metal film 21 from the side of the dielectric substrate 22, the first grating structure 24 acts as a surface plasmon source since surface plasmon is excited by the first grating structure 24. Surface plasmon generated by the first grating structure 24 propagate along the surface of the metal film 21 until it reaches the second lattice 25 formed in the central portion of the metal film 21. Since surface plasmon shows straight propagation property, surface plasmon generated from the first grating structure 24 propagates until it reaches the second grating structure 25. At the position of the second lattice, surface plasmon separates into two branches and then propagates to the third lattice 26 and the fourth lattice 27, respectively. Here, a separation ratio of surface plasmon varies depending on the shape of the second grating structure 25. Since surface plasmon propagates until it reaches the third grating structure 26 and the fourth grating structure 27 and are converted to light by the respective grating structures 26 and 27, the third grating structure 26 and the fourth grating structure 27, respectively act as the first detector and the second detector. In this embodiment, a surface plasmon splitter separated into two portions is shown but the present invention is not limited to this embodiment.

Figure 9:
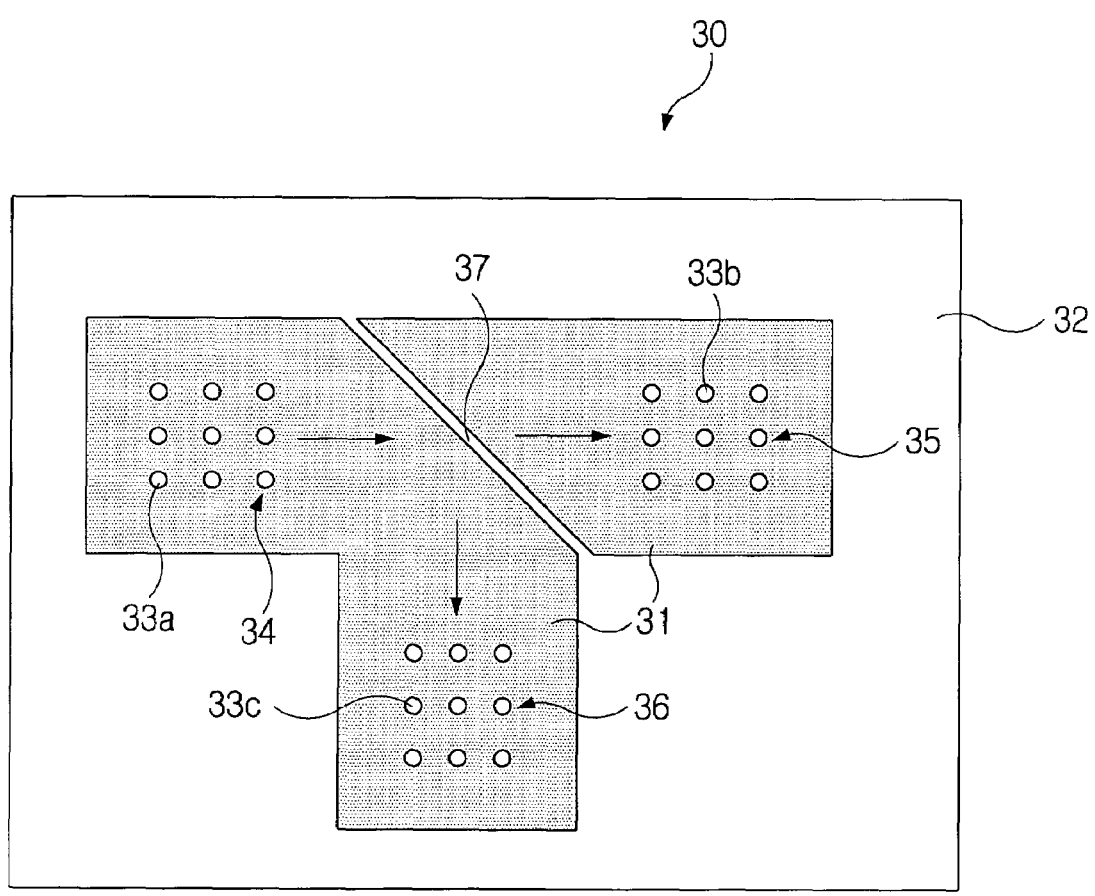
FIG. 9 is a plane view of a surface plasmon splitter according to another embodiment of the present invention.

FIG. 9 is a plan view of a surface plasmon splitter 30 of another embodiment. As shown in FIG. 9, a metal film 31 is formed on a dielectric substrate 32 such as a sapphire in T lettered shape. A first grating structure 34 having periodically arranged apertures or cylinders 33a which acts as a surface plasmon generator is formed at one end of the metal film 31 and a second grating structure 35 having periodically arranged apertures or cylinders 33b is formed at the other end of the metal film 31 opposite to the one end thereof. At a portion of the metal film 31 extending downwardly from a midway portion of the metal film 31 are formed periodically arranged apertures or cylinder 33c. A gap 37, for example below 200 nm width is formed slantwise with negative slope at the midway portion of the metal film 31 between the first grating structure 34 and the second grating structure 35. The gap 37 is filled with dielectric substance of selected dielectric constant.

When horizontally polarized light, like in the surface plasmon splitter 20 shown in FIG. 8, is incident on the first grating structure 34 of the metal film 31 from the side of the dielectric substrate 32, the first grating structure 34 acts as surface plasmon generator since surface plasmon is excited by the first grating structure 34. Surface plasmon generated from the first grating structure 34 propagates along the surface of the metal film 31 until it reaches the gap 37 at the midway portion of the metal film 31. A portion of surface plasmon propagated from the first grating structure 34 is reflected on the face slanted to form the gap 37 and propagation direction of surface plasmon turns toward the third grating structure 36. The remaining portion of the surface plasmon propagates through the gap 37 to the second grating structure 35 due to a tunneling effect. Accordingly, since surface plasmon propagates until it reaches the second grating structure 35 and the third grating structure 36 and is then converted to light by the respective grating structure 35 and 36, the second grating structure 35 and the third grating structure 36, respectively act as a first detector and a second detector. At this time, by controlling a size of the gap between two portions of metal films and the dielectric constant of dielectric substance filled therebetween, the separation ratio is controlled and also by controlling an angle of metal interfaces which form the gap, the propagation direction of surface plasmon being reflected can vary.

Figure 10:
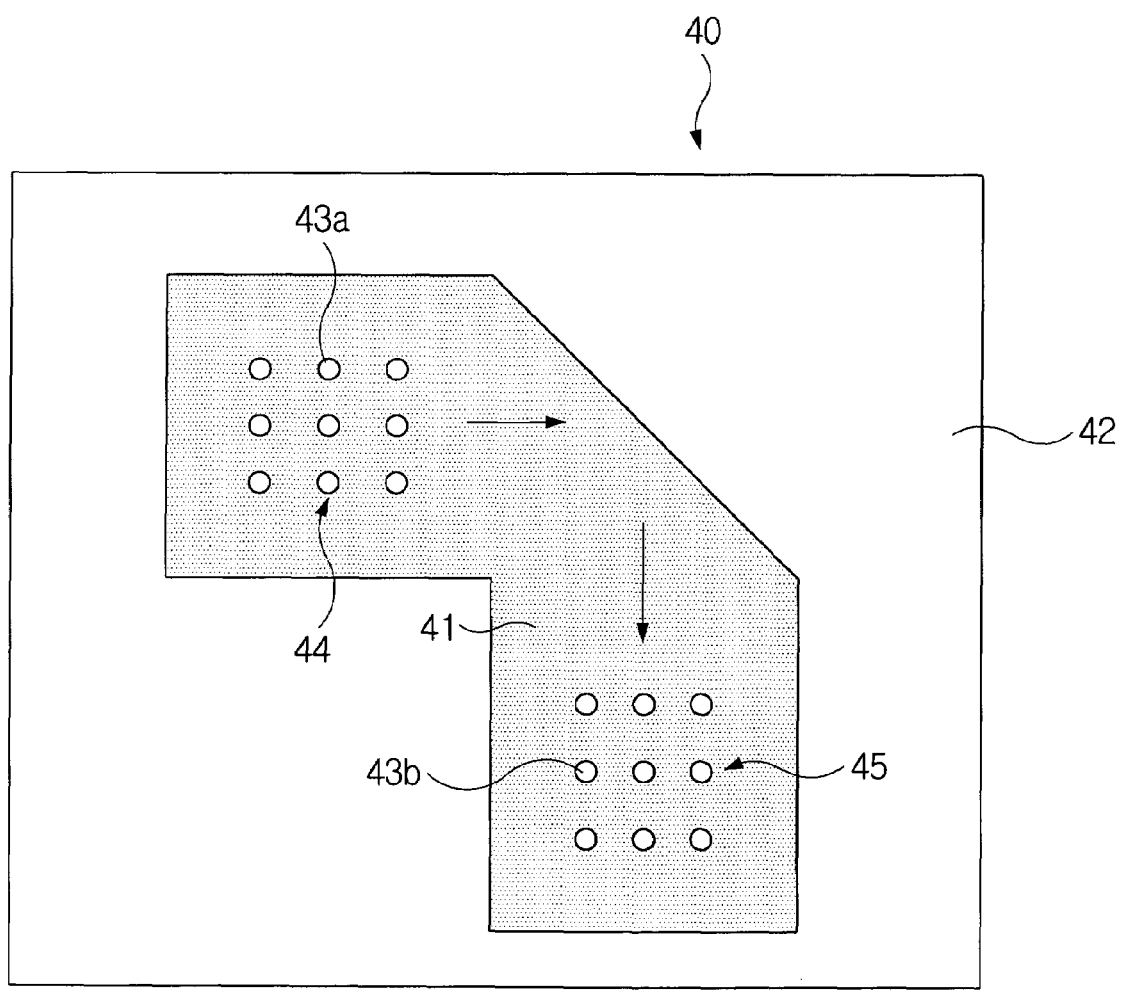
FIG. 10 is a plane view of a surface plasmon mirror according to an embodiment of the present invention.

FIG. 10 is a plan view of a surface plasmon mirror 40 according to the present invention. As shown in FIG. 10, a metal film 41 is formed on a dielectric substrate 42 such as a sapphire in the shape of "ㄱ". On one end of the metal film 41 are formed periodically arranged apertures 43a with a first grating structure 44 and on the other end of the metal film 41 making a right angle with the first grating structure 44 are formed periodically arranged apertures 43b with a second grating structure 45. A portion of the first grating structure 44 crossing with the second grating structure 45 includes a slantwise cut portion.

The surface plasmon mirror 40 of FIG. 10 has the same structure as the surface plasmon splitter 30 of FIG. 9 excepting the second lattice matrix 35 of the metal film is formed in the surface plasmon splitter 30 of FIG. 9. When horizontally polarized light is incident on the first grating structure 44 from the side of the dielectric substrate 42, the first grating structure 44 acts as a surface plasmon generator since surface plasmon is excited by the first grating structure 44. If surface plasmon generated in the first grating structure 44 propagates along the surface of the metal film and reaches a midway portion of the metal film 41 cut slantwise, the propagation direction of the surface plasmon turns towards the second grating structure 45 due to the reflection of the surface plasmon on the slanted portion of the metal film. Surface plasmon propagated until it reaches the second grating structure 45 is converted to light by the second grating structure 45, and the second grating structure 45 thus acts as a detector.

Figure 11:
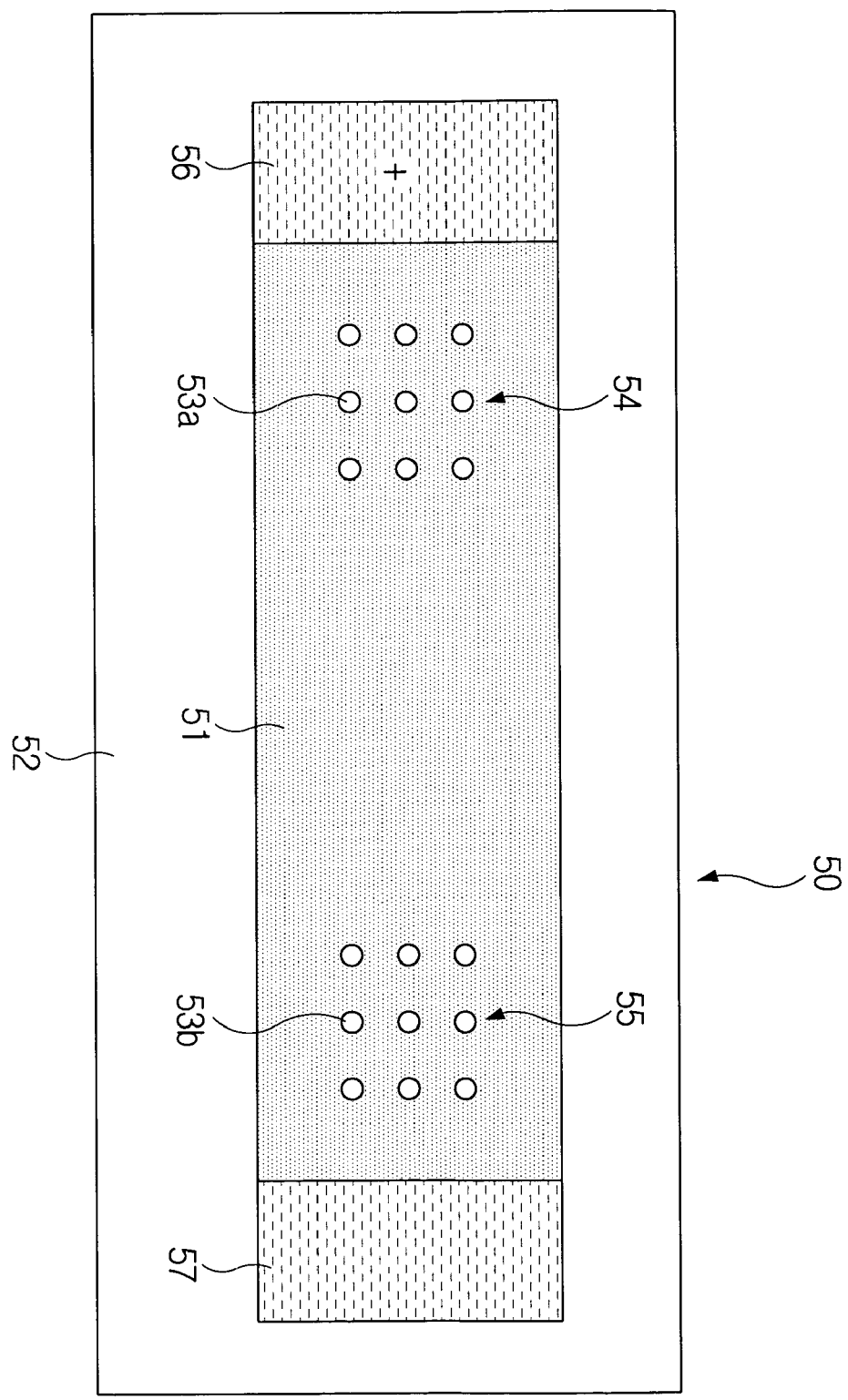
FIG. 11 is a plane view of a surface plasmon controlling apparatus using electric field according an embodiment of the present invention.

FIG. 11 is a plan view of a surface plasmon controlling apparatus 50 according to another embodiment of the present invention. As shown in FIG. 11, a surface plasmon controlling apparatus 50 includes a dielectric substrate 52 such as a sapphire; a metal film 51 formed on the dielectric substrate 52 in the form of band; and a pair of electrodes formed at both ends of the metal film 51. On one end of the metal film 51 are formed periodically arranged apertures 53a with a first grating structure 54 and on the other end of the metal film 51 opposite to the one end thereof are formed periodically arranged apertures 53b with a second grating structure 55.

When horizontally polarized light is incident on the first grating structure 54 from the side of the dielectric substrate 52, the first grating structure 54 acts as a surface plasmon source since surface plasmon is excited by the first grating structure 54. Surface plasmon generated in the first grating structure 54 propagates along the surface of the metal film until it reaches the second grating structure. Surface plasmon propagated until it reaches the second grating structure 55 is converted to light in the form of stripe perpendicular to the polarization direction of the incident light by the second grating structure, and the second grating structure 55 thus acts as a detector.

At this time, by applying electric filed to a pair of electrodes 56 and 57, surface plasmon propagated along the surface of the metal film 51 until it reaches the second grating structure 55 can be controlled. For example, when a positive voltage is applied to the electrode 56 and a negative voltage is applied to the electrode 57, Since the direction of the electric field by the voltage applied to electrodes 56 and 57 is the same that the propagation direction of surface plasmon, further more surface plasmon propagates until it reaches the second grating structure 55, and light in the form of stripe-like patterns perpendicular to the polarization direction of the incident light is thus emitted. Conversely, when a negative voltage is applied to the electrode 56 and a positive voltage is applied to the electrode 57, Since the direction of the electric field by the voltage applied to electrodes 56 and 57 is opposite to the propagation direction of surface plasmon, thus interfering the propagation of surface plasmon, light is not emitted from the second grating structure 55.

In this embodiment, the control method due to the electric filed is described. However, instead of the electrodes, as described above, since the propagation direction of surface plasmon is parallel to the polarization direction of the incident light, surface plasmon can also be controlled by varying the polarization direction of the incident light.

FIG. 12a is a perspective, schematic diagram showing a light transmission apparatus of the present invention utilized as a photolithographic mask 60 according to the present invention, and FIG. 12b is a perspective, schematic diagram of a photoresist-layered substrate showing a resulting pattern using a photolithographic mask. As shown in FIG. 12a, a metal film 62 is formed on a dielectric substrate 61 such as a sapphire and the metal film 62 includes periodically arranged apertures 63. At this time, a pattern to form on the photoresist-layered substrate is determined depending on the wavelength and polarization of the incident light. In particular, when light is incident from the side of the dielectric substrate 61 and the wavelength thereof matches the resonant condition of air/metal surface plasmon, light in form of stripe-like patterns is emitted if the light polarization is controlled. The emitted light shows a complicated pattern near the metal lattice. However, it shows a simple sine wave at the distance of a few hundred nanometers therefrom and this sine wave persists for more than a few ten microns of distance. Accordingly, when a photoresist-layered substrate 64 is disposed at a few microns of distance away from the metal film 62, the emitted light in a form of sine wave is exposed to the photo-layered substrate 64 and clear line-like patterns are thus formed.

Although the present invention is explained with reference to preferable embodiments regarding the surface plasmon apparatus, the present invention is not limited to these embodiments. For example, It will be apparent to those skilled in the art that variations and modifications to enhance the efficiency of optic devices and apparatus are possible without deviating from the spirit and broad teachings of the invention.

INDUSTRIAL APPLICABILITY

According to the present invention, a metal film is formed on dielectric substrate and periodically arranged apertures with a grating structure are formed on the metal film. When light is incident on the periodic aperture array of the metal film from the side of the dielectric substrate, surface plasmon is excited from the side of the metal film with the periodic aperture array and surface plasmon propagating in a selected direction can thus be generated efficiently and easily. Also, a periodic aperture or cylinder array formed in the metal film in combination with a local light detector can act as a surface plasmon detector. And, according to the present invention, by providing a surface plasmon splitter and a surface plasmon mirror, it is possible to control the propagation of the surface plasmon efficiently. The invention will play an important role in enhancing the efficiency of optic devices using the surface plasmon. In addition, in the present invention, by using the characteristics that light generated from the surface plasmon persists its pattern until it reaches a few macroscopic distances under a selected condition and that the pattern can vary with the control of the wavelength and polarization of the incident light, a photolithographic apparatus with a new concept can be provided.

What is claimed is:

1. A surface plasmon splitter, comprising:
   a dielectric substrate having a first surface and a second surface; an optically thick metal film having a first surface and a second surface, the first surface of the metal film being substantially contacted to the second surface of the dielectric substrate and having one side portion, a middle portion and the other side portion extended from the middle portion, and the metal film being divided into at least two or more portions;
   a first periodic array of nanometer-sized apertures which penetrate the first and second surfaces of the metal film, formed at the one side portion of the metal film;
   a second periodic array of nanometer-sized apertures which penetrate the first and second surfaces of the metal film, formed at the middle portion of the metal film;
   a third periodic array of nanometer-size apertures which penetrate the first and second surfaces of the metal film, formed respectively at two or more divided portions of the other side portion; and
   wherein light polarized in the same direction as a direction directed from the first periodic array to the second periodic array is incident from the first surface of the dielectric substrate to the first periodic array of the metal film, and air-metal mode surface plasmon is excited on the second surface of the metal film and propagated along the metal film to second periodic array,
   and the surface plasmon propagated to the second periodic array is divided at the second periodic array and propagated to the third periodic array,
   and thus the light is emitted from the third periodic array.

2. The splitter according to claim 1, wherein the dielectric substrate is a sapphire substrate.

* * * * *